(12) United States Patent
Miyazaki et al.

(10) Patent No.: US 9,145,468 B2
(45) Date of Patent: Sep. 29, 2015

(54) PHOTOELECTRIC CONVERSION MATERIAL, METHOD FOR PRODUCING THE SAME, AND ORGANIC PHOTOVOLTAIC CELL CONTAINING THE SAME

(71) Applicant: HONDA MOTOR CO., LTD., Minato-Ku, Tokyo (JP)

(72) Inventors: Takahiro Miyazaki, Wako (JP); Kazuhiro Miura, Wako (JP); Tadahiro Shiba, Wako (JP)

(73) Assignee: Honda Motor Co., Ltd., Tokyo (JP)

( * ) Notice: Subject to any disclaimer, the term of this patent is extended or adjusted under 35 U.S.C. 154(b) by 0 days.

(21) Appl. No.: 14/445,393

(22) Filed: Jul. 29, 2014

(65) Prior Publication Data
US 2015/0038666 A1 Feb. 5, 2015

(30) Foreign Application Priority Data

Aug. 2, 2013 (JP) .................................. 2013-161837
Aug. 2, 2013 (JP) .................................. 2013-161846

(51) Int. Cl.
*C08G 61/10* (2006.01)
*H01L 51/00* (2006.01)
*H01L 51/42* (2006.01)

(52) U.S. Cl.
CPC ............ *C08G 61/10* (2013.01); *H01L 51/0038* (2013.01); *C08G 2261/12* (2013.01); *C08G2261/312* (2013.01); *C08G 2261/46* (2013.01); *C08G 2261/91* (2013.01); *H01L 51/4253* (2013.01)

(58) Field of Classification Search
CPC ............. C08G 61/10; C08G 2261/312; H01L 51/0047; H01L 51/4253
USPC ........................................ 528/125, 373, 370
See application file for complete search history.

(56) References Cited

U.S. PATENT DOCUMENTS

2009/0151787 A1    6/2009  Yoshikawa et al.
2010/0038629 A1    2/2010  Lazarev

FOREIGN PATENT DOCUMENTS

| JP | 2007-019086 A | 1/2007 |
| JP | 2007-273939 A | 10/2007 |
| JP | 4005571 B2 | 11/2007 |
| JP | 2010-056492 A | 3/2010 |
| JP | 2010-508677 A | 3/2010 |

*Primary Examiner* — Shane Fang
(74) *Attorney, Agent, or Firm* — Carrier Blackman & Associates, P.C.; Jospeh P. Carrier; Anne G. Sabourin

(57) ABSTRACT

A bulk heterojunction-type organic photovoltaic cell, i.e., BHJ solar cell, has a photoelectric conversion layer containing a mixture of a donor domain and an acceptor domain. The donor domain contains a polymer as a donor (photoelectric conversion material), and the polymer is obtained by reaction of a polyphenylene having a structural unit selected from moieties represented by the following general formulae (1) to (3). For example, the acceptor domain contains phenyl-$C_{61}$-butyric acid methyl ester (PCBM) as an acceptor. R1 to R8 in the general formulae (1) to (3) independently represent a hydrogen atom, an alkyl group, or an alkoxy group.

(1)
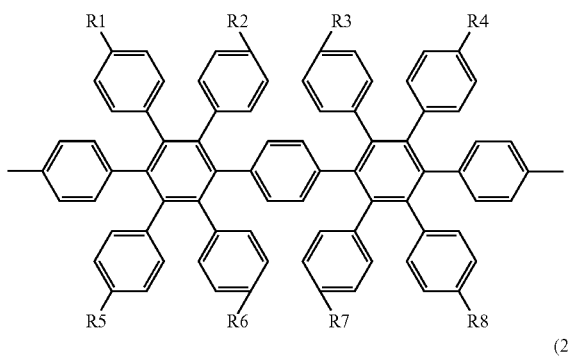
(2)
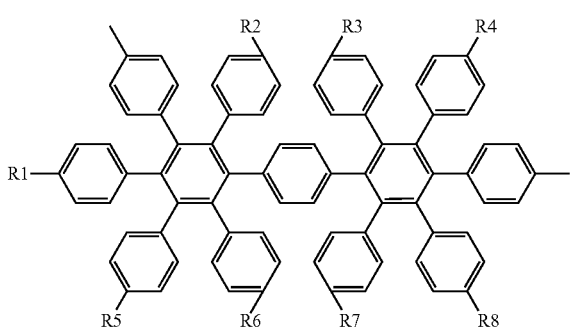
-continued
(3)
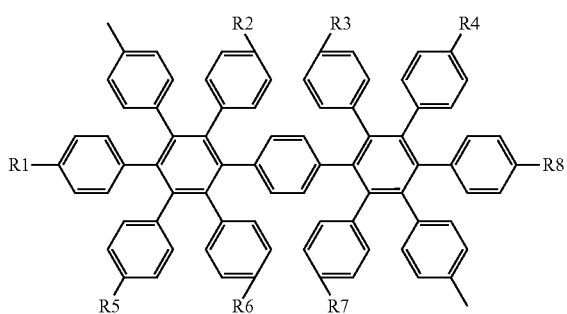
11 Claims, 9 Drawing Sheets

PHOTOELECTRIC CONVERSION MATERIAL, METHOD FOR PRODUCING THE SAME, AND ORGANIC PHOTOVOLTAIC CELL CONTAINING THE SAME

CROSS-REFERENCE TO RELATED APPLICATIONS

This application is based upon and claims the benefit of priority from Japanese Patent Applications No. 2013-161837 filed on Aug. 2, 2013 and No. 2013-161846 filed on Aug. 2, 2013, the contents all of which are incorporated herein by reference.

BACKGROUND OF THE INVENTION

1. Field of the Invention

The present invention relates to a photoelectric conversion material containing a polymer having a condensed aromatic ring structural unit, a method for producing the photoelectric conversion material, and an organic photovoltaic cell using the photoelectric conversion material.

2. Description of the Related Art

Organic photovoltaic cells using organic materials, which can be easily produced by a low-cost process such as a roll-to-roll process, have attracted much attention. Such organic photovoltaic cells include bulk heterojunction-type organic photovoltaic cells (hereinafter referred to also as BHJ solar cells).

The BHJ solar cell has a photoelectric conversion layer for converting a light into electricity, and the photoelectric conversion layer contains a mixture of a donor domain and an acceptor domain. The donor domain contains a photoelectric conversion material that acts as an electron donor, and the acceptor domain contains a photoelectric conversion material that acts as an electron acceptor. Specifically, the photoelectric conversion layer is interposed between positive and negative electrodes. When sunlight is introduced through the positive electrode into the photoelectric conversion layer, an exciton is generated in the layer.

The exciton reaches an interface between the donor and acceptor domains, and then is divided into an electron and a hole. The electron is transferred through the acceptor domain to the negative electrode, while the hole is transferred through the donor domain to the positive electrode. The hole and the electron are utilized to generate an electrical energy for energizing an external circuit electrically connected to the negative and positive electrodes.

As described in Japanese Laid-Open Patent Publication No. 2007-273939, typical examples of the photoelectric conversion materials, i.e., the donor and the acceptor, used in the photoelectric conversion layer having the above function include poly(3-hexylthiophene) (P3HT, see FIG. 7) and phenyl-$C_{61}$-butyric acid methyl ester (PCBM, see FIG. 8) respectively.

P3HT and PCBM have energy levels of highest occupied molecular orbital (HOMO) and lowest unoccupied molecular orbital (LUMO) shown in FIG. 9. When the light is introduced into the photoelectric conversion layer as described above, an electron is transited from the HOMO to the LUMO in the P3HT functioning as a donor. Thus, the energy level difference between the HOMO and the LUMO of P3HT corresponds to the bandgap (Eg).

Then, the electron transited to the LUMO of P3HT is transferred to the LUMO of the PCBM functioning as an acceptor, whereby the electron and the hole are generated. Thus, the energy level difference between the LUMO of P3HT and the LUMO of PCBM results in the energy loss, and the energy level difference between the HOMO of P3HT and the LUMO of PCBM corresponds to the open circuit voltage (Voc).

As the photoelectric power conversion efficiency of the solar cell becomes higher, the area required for achieving a desired power generation capacity is reduced. Therefore, advantageously, the weight and the installation area of the solar cell can be reduced, so that the layout of the solar cell can be designed more freely.

The photoelectric power conversion efficiency of the organic photovoltaic cell such as the BHJ solar cell can be increased by (a) improving the absorption of a light to accelerate the exciton generation, (b) improving the absorption of a long-wavelength (near-infrared) light to increase the sunlight utilization efficiency, (c) increasing the open circuit voltage Voc, etc. In view of achieving the procedures of (a) to (c), a donor having (A) a high absorbance coefficient, (B) a small energy level difference between the HOMO and LUMO (a narrow bandgap Eg), and (C) a LUMO energy level close to that of the acceptor may be selected.

Condensed aromatic ring compounds (i.e., π-electron conjugated compounds) described in Japanese Patent No. 4005571 and Japanese Laid-Open Patent Publication Nos. 2010-056492, 2007-019086, and 2010-508677 (PCT) may have the above properties of (A) to (C). Such condensed aromatic ring compounds are sometimes referred to as graphenes (see Japanese Laid-Open Patent Publication No. 2007-019086).

SUMMARY OF THE INVENTION

In a technology described in Japanese Patent No. 4005571, a functional group is bonded to hexabenzocoronene (HBC), and the resultant molecules are self-assembled utilizing the functional groups to obtain a so-called nanotube-like aggregate. Thus, a large number of processes are required to obtain the final semiconductor product. In addition, it is unclear whether the obtained aggregate is a p-type (donor) or an n-type (acceptor).

In Japanese Laid-Open Patent Publication No. 2010-056492, it is suggested that a nanotube composed of an HBC aggregate has both of a hole-conducting path and an electron-conducting path. In a technology described in Japanese Laid-Open Patent Publication No. 2010-056492, the inner and outer surfaces of the nanotube are covered with a fullerene, and the coverage is selected to thereby control the hole mobility in HBC. It is clear from the above that the electron-donating property of HBC per se cannot be improved in the technologies of Japanese Patent No. 4005571 and Japanese Laid-Open Patent Publication No. 2010-056492.

In a technology described in Japanese Laid-Open Patent Publication No. 2007-019086, a functional group having a fluorine atom is bonded to a graphene derivative to obtain an n-type semiconductor. Thus, in this technology, a donor cannot be produced though the acceptor is obtained.

All of Japanese Patent No. 4005571 and Japanese Laid-Open Patent Publication Nos. 2010-056492, 2007-019086, and 2010-508677 (PCT) disclose only organic low-molecular compounds. As is well known, such organic low-molecular compounds are poorly soluble in an organic solvent. Therefore, disadvantageously, it is difficult to use the roll-to-roll process or the like in order to form the photoelectric conversion layer containing the compound.

A principal object of the present invention is to provide a photoelectric conversion material that has an excellent property as an electron donor or acceptor and enables a photoelectric conversion layer to be formed simply and easily.

Another object of the present invention is to provide a method for producing the above-mentioned photoelectric conversion material.

A further object of the present invention is to provide an organic photovoltaic cell having a photoelectric conversion layer containing the above-mentioned photoelectric conversion material.

According to an aspect of the invention, there is provided a photoelectric conversion material that acts as an electron donor for donating an electron or an electron acceptor for accepting an electron. The photoelectric conversion material contains a polymer obtained by reaction of a polyphenylene having at least one structural unit selected from moieties represented by the following general formulae (1) to (3):

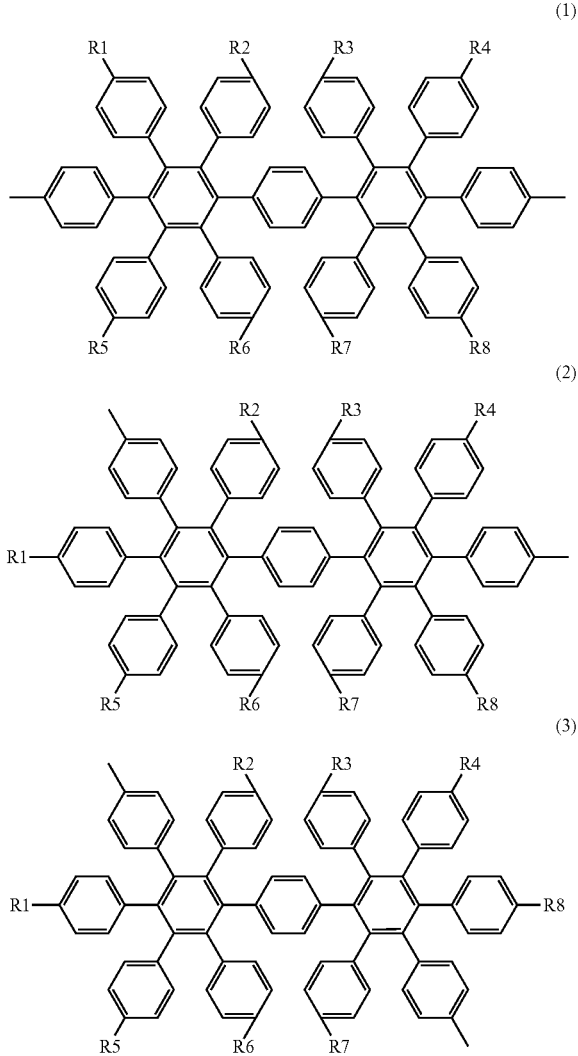

wherein R1 to R8 in the general formulae (1) to (3) independently represent a hydrogen atom, an alkyl group, or an alkoxy group.

The polyphenylene having the structural unit selected from the moieties represented by the general formulae (1) to (3) is reacted to generate a π-conjugated polymer. The π-conjugated polymer has a condensed aromatic ring, and a π-electron cloud is spread over the entire polymer. The π-conjugated polymer is hereinafter referred to also as "nanographene polymer". The nanographene polymer can have a high absorbance coefficient and can actively generate an exciton because the π-electron cloud spreads along the main chain. Furthermore, the nanographene polymer can exhibit a small energy level difference between the HOMO and the LUMO, and thus can have a narrow bandgap Eg. In addition, the nanographene polymer can have a maximum absorption wavelength shifted to the long-wavelength side, and thereby can excellently absorb a long-wavelength (near-infrared) light. Consequently, the nanographene polymer can exhibit an improved sunlight utilization efficiency.

Furthermore, the nanographene polymer can have a LUMO energy level lower (deeper) than those of P3HT and the like. Therefore, a photoelectric conversion layer using the nanographene polymer as a donor and the PCBM as an acceptor can exhibit an energy loss lower than that of a layer using the P3HT as a donor. Consequently, an organic photovoltaic cell using the nanographene polymer as the donor in the photoelectric conversion layer can exhibit a high open circuit voltage Voc.

For the above reasons, the organic photovoltaic cell containing the nanographene polymer as the photoelectric conversion material can have an improved photoelectric power conversion efficiency.

In a case where the structural unit represented by one of the general formulae (1) to (3) in the polyphenylene has at least one alkyl or alkoxy group as a side chain in at least one of R1 to R8, the nanographene polymer can be obtained more easily. In the reaction of the polyphenylene for preparing the nanographene polymer, the side chains act as steric hindrances for preventing a plurality of the structural units from coming close to each other. Therefore, reaction in each of the structural units in the polyphenylene can sufficiently proceed while preventing the cross-linking between the structural units. Consequently, the nanographene polymer having the condensed aromatic ring structural units, over which the π-electron cloud is sufficiently spread, can be easily produced by the reaction. In this case, the produced nanographene polymer has one or both of the soluble alkyl and alkoxy groups.

The solubility of the nanographene polymer in an organic solvent can be improved in this manner. Particularly, in a case where the nanographene polymer is derived from the polyphenylene having the alkoxy group as the side chain and thereby has the alkoxy group as the side chain, the nanographene polymer can exhibit further improved solubility.

Therefore, even in a case where the molecular weight of the condensed aromatic ring is increased in order to improve the sunlight utilization efficiency, the nanographene polymer can be readily dissolved in the organic solvent. Thus, the photoelectric conversion layer can be formed simply and easily by using a spin coating process, a roll-to-roll process, etc.

In a case where the alkoxy group has 1 to 20 carbon atoms, the structural units in the polyphenylene can be prevented from coming close to each other, and the solubility of the nanographene polymer in the organic solvent can be sufficiently increased. Thus, when the carbon number of the alkoxy group is within the above range, the nanographene polymer, which can exhibit an excellent property as the donor and can be sufficiently dissolved in the organic solvent to form the layer simply and easily, can be efficiently produced.

Preferred examples of the nanographene polymers include polymers having at least one structural unit selected from graphenes represented by the following general formulae (4) to (7):

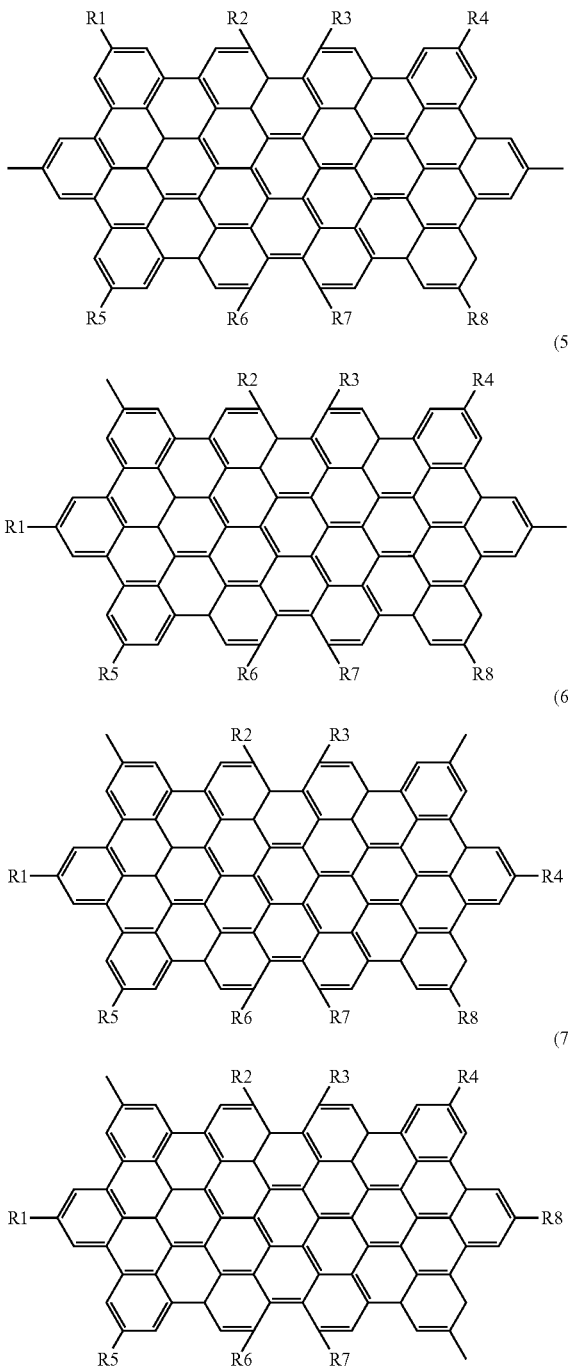

(4)
(5)
(6)
(7)

wherein R1 to R8 in the general formulae (4) to (7) independently represent a hydrogen atom, an alkyl group, or an alkoxy group.

In the present invention, the condensed aromatic ring is referred to as "graphene" as in Japanese Laid-Open Patent Publication No. 2007-019086. Nanometer-scale graphene such as the structural units represented by the general formulae (4) to (7) is also referred to as "nanographene".

The nanographene polymer preferably has a polymerization degree (the number of the structural units) of 2 to 150. When the polymerization degree is 2 or more, the absorbance coefficient can be sufficiently increased, and the Eg can be sufficiently narrowed. On the other hand, when the polymerization degree is 150 or less, the time required for the polymerization can be shortened, and the production efficiency of the nanographene polymer can be improved. Thus, when the polymerization degree is within the above range, the nanographene polymer can be efficiently produced with an excellent donor property.

In the case of using the above graphene as the structural unit of the nanographene polymer, the nanographene polymer has a molecular weight of 1,900 to 500,000.

According to another aspect of the invention, there is provided a method for producing a photoelectric conversion material that acts as an electron donor for donating an electron or an electron acceptor for accepting an electron. The method contains polymerizing a phenylene derivative to prepare a polyphenylene and reacting the polyphenylene to prepare a polymer as the photoelectric conversion material. The polyphenylene has at least one structural unit selected from moieties represented by the following general formulae (1) to (3):

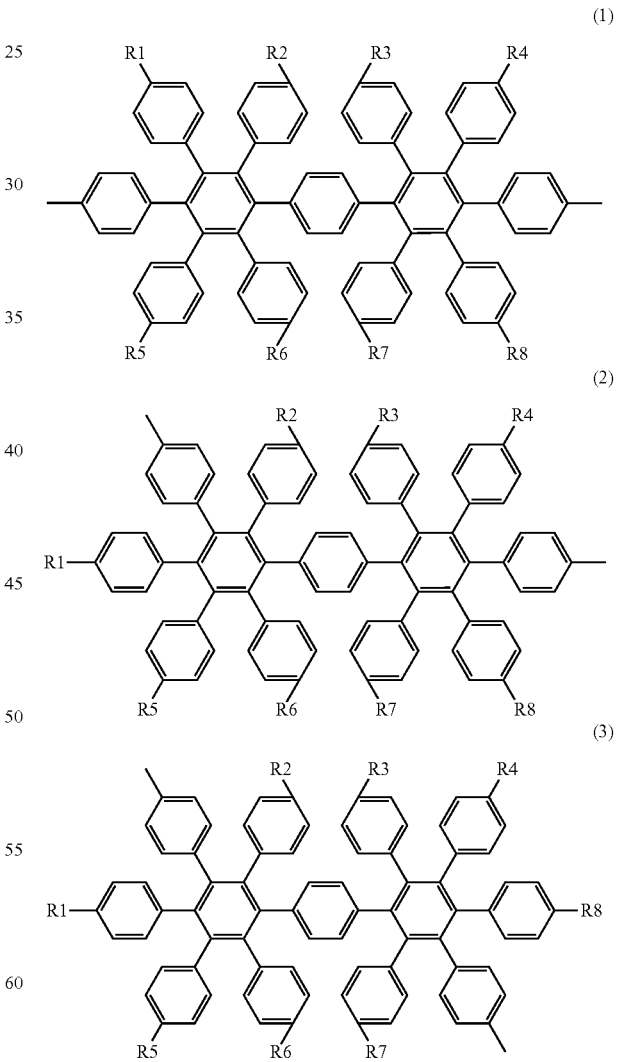

(1)
(2)
(3)

wherein R1 to R8 in the general formulae (1) to (3) independently represent a hydrogen atom, an alkyl group, or an alkoxy group.

The method is capable of readily producing the nanographene polymer with a uniform structure as the photoelectric conversion material (the donor or the acceptor).

In this method, in a case where the alkoxy group has 1 to 20 carbon atoms, the nanographene polymer, which can exhibit an excellent property as the donor and can be sufficiently dissolved in the organic solvent to form the layer easily, can be efficiently produced.

In a typical example, the nanographene polymer has at least one structural unit selected from graphenes represented by the following general formulae (4) to (7):

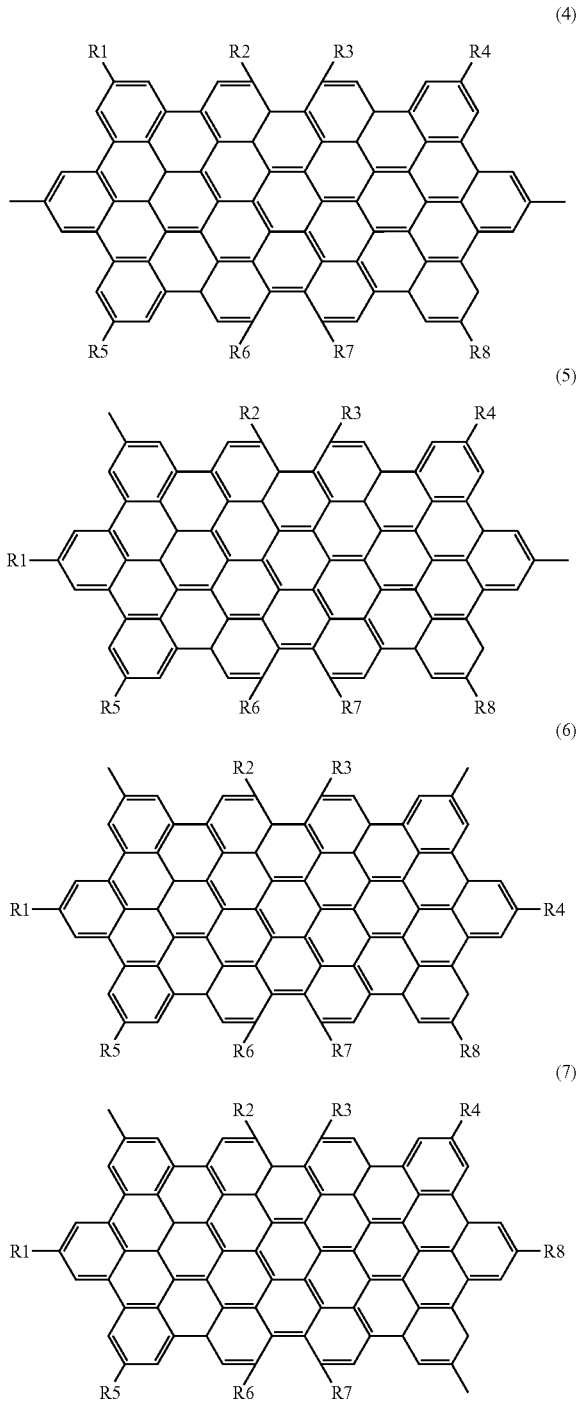

wherein R1 to R8 in the general formulae (4) to (7) independently represent a hydrogen atom, an alkyl group, or an alkoxy group.

In the present invention, for example, first, the phenylene derivative having the alkoxy group is prepared and polymerized to obtain the polyphenylene having the alkoxy group. The polyphenylene is then reacted to produce the nanographene polymer (the photoelectric conversion material) containing the nanographene structural unit having the alkoxy group.

It is preferred that the polymerization degree of the nanographene polymer is controlled to be within a range of 2 to 150 for the above reasons. For example, the polymerization degree of 2 to 150 can be achieved by appropriately selecting the reaction temperature and/or the reaction time in the polymerization.

According to a further aspect of the invention, there is provided an organic photovoltaic cell using the above-described photoelectric conversion material. The organic photovoltaic cell has a photoelectric conversion layer containing the photoelectric conversion material as an electron donor.

In the organic photovoltaic cell, for example, in the case of using PCBM as an acceptor, the photoelectric conversion layer using the nanographene polymer as the donor can exhibit a higher absorbance coefficient and can have a maximum absorption wavelength shifted to the longer-wavelength side as compared with a layer using P3HT. Furthermore, the donor can exhibit a narrower bandgap Eg. In addition, the donor can have a LUMO energy level closer to the LUMO energy level of the PCBM acceptor.

Therefore, the organic photovoltaic cell can exhibit an active exciton generation property, an improved sunlight utilization efficiency, and a high open circuit voltage Voc. Thus, the organic photovoltaic cell can have an improved photoelectric power conversion efficiency.

Since the organic photovoltaic cell has a high photoelectric power conversion efficiency, only a smaller area is required for achieving a desired power generation capacity in comparison with the other photovoltaic cells having the same power generation capacity. Therefore, the organic photovoltaic cell can have a light weight and a small load applied on its installation site. Furthermore, the organic photovoltaic cell can be placed in a smaller site, so that the layout of the solar cell can be designed more freely.

When the nanographene polymer has at least one of alkyl group and alkoxy group, the nanographene polymer exhibits an improved solubility in an organic solvent. Therefore, even in a case where the molecular weight of the condensed aromatic ring in the nanographene polymer is increased in order to improve the sunlight utilization efficiency, the photoelectric conversion layer can be formed simply and easily from the nanographene polymer. Thus, the organic photovoltaic cell can be produced simply and easily with an excellent photoelectric power conversion efficiency.

For example, the organic photovoltaic cell is preferably a bulk heterojunction-type organic photovoltaic cell having a photoelectric conversion layer containing a mixture of a donor domain and an acceptor domain. The bulk heterojunction-type photovoltaic cell has a larger contact area between the donor and acceptor domains, as compared with a planar heterojunction-type photovoltaic cell having a donor layer and an acceptor layer formed separately from each other. In the organic photovoltaic cell, the exciton is divided into the electron and hole mainly on the interface between the donor and acceptor domains thereby for power generation. Therefore, in a case where the organic photovoltaic cell is formed as the bulk heterojunction-type, which has a larger contact area between the donor and acceptor domains, the photoelectric power conversion efficiency can be improved.

Particularly, the nanographene polymer having the alkoxy group is readily soluble in the organic solvent, whereby the photoelectric conversion layer can be easily formed in the bulk heterojunction-type organic photovoltaic cell by use of the nanographene polymer. The photoelectric conversion layer can contain a mixture of the donor and acceptor domains in a desired phase separation state. Thus, the charge separation efficiency of the photoelectric conversion layer can be improved, and the photoelectric power conversion efficiency of the organic photovoltaic cell can be improved.

The above and other objects, features and advantages of the present invention will become more apparent from the following description when taken in conjunction with the accompanying drawings in which a preferred embodiment of the present invention is shown by way of illustrative example.

DESCRIPTION OF THE PREFERRED EMBODIMENTS

A preferred embodiment of the photoelectric conversion material and the production method of the present invention will be described in detail below, using a bulk heterojunction-type organic photovoltaic cell having a photoelectric conversion layer containing the material with reference to the accompanying drawings.

Figure 1:
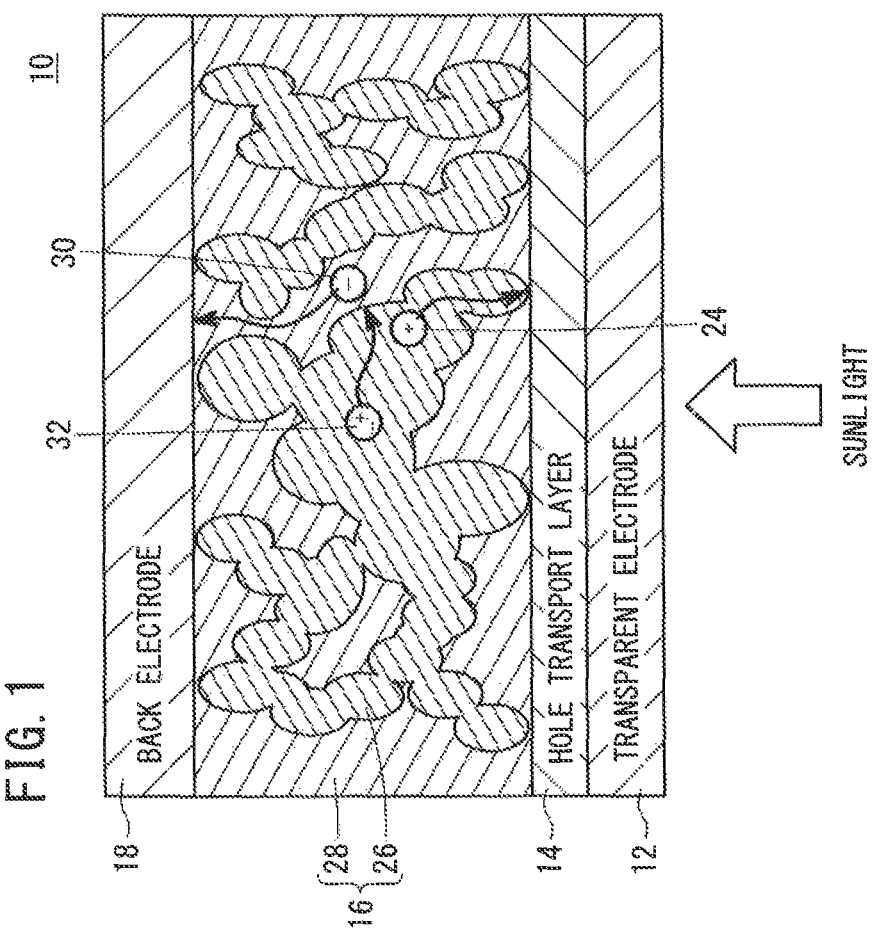
FIG. 1 is a schematic longitudinal cross-sectional view of a principal part in a bulk heterojunction-type organic photovoltaic cell according to an embodiment of the present invention.

FIG. 1 is a schematic longitudinal cross-sectional view of a principal part in a bulk heterojunction-type organic photovoltaic cell (BHJ solar cell) 10 according to this embodiment. In the BHJ solar cell 10, a hole transport layer 14, a photoelectric conversion layer 16, and a back electrode 18 are stacked in this order on a transparent electrode 12.

The transparent electrode 12 acts as a positive electrode. Thus, holes 24 are transferred to the transparent electrode 12. The transparent electrode 12 may be composed of a material having a sufficient transmittance of a light such as sunlight, and examples of such materials include indium-tin composite oxide (ITO).

The hole transport layer 14 acts to accelerate the transfer of the holes 24 from the photoelectric conversion layer 16 to the transparent electrode 12. In general, the hole transport layer 14 may contain a poly(3,4-ethylenedioxythiophene) doped with a polystyrene sulfonic acid, i.e., a so-called PEDOT:PSS.

The photoelectric conversion layer 16 contains a combination of a donor domain 26 and an acceptor domain 28. The donor domain 26 contains a photoelectric conversion material that acts as an electron donor (donor), and the acceptor domain 28 contains a photoelectric conversion material that acts as an electron acceptor (acceptor). Preferred examples of the photoelectric conversion materials as the acceptor include PCBM.

The donor is a p-type semiconductor composed of a photoelectric conversion material according to this embodiment. The photoelectric conversion material of this embodiment contains a nanographene polymer, which is a reaction product of a polyphenylene having at least one structural unit selected from moieties represented by the following general formulae (1) to (3).

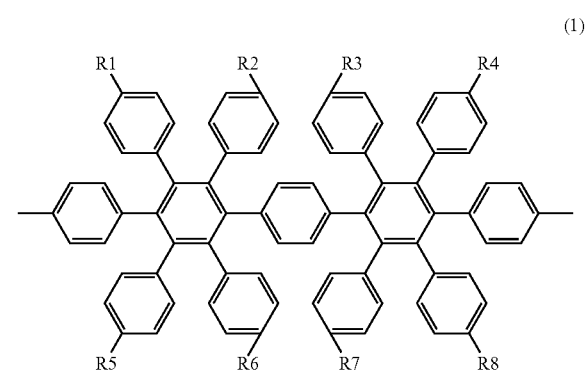

(1)

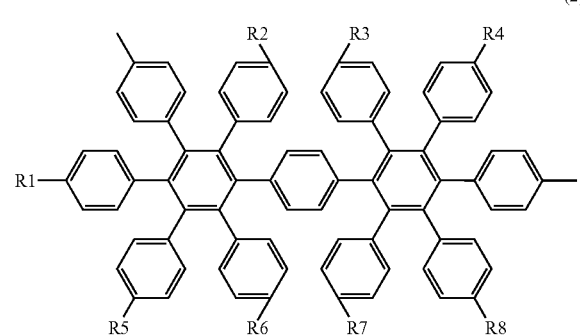

(2)

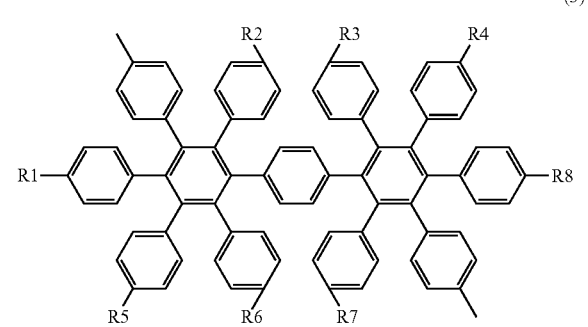

(3)

R1 to R8 in the general formulae (1) to (3) independently represent a hydrogen atom, an alkyl group, or an alkoxy group.

Thus, the polyphenylene has at least one structural unit selected from the moieties represented by the general formulae (1) to (3). The polyphenylene may contain only one type of the moieties represented by one of the general formulae (1) to (3), and the moieties may be bonded to each other, but the polyphenylene is not limited thereto. For example, the polyphenylene may be such that the moieties represented by the general formulae (1) to (3) are randomly bonded.

R1 to R8 in the general formula (1) may be hydrogen atoms in the polyphenylene, and the nanographene polymer may be prepared by reacting the polyphenylene. This example will be described below. In this case, it is preferred that all the aromatic rings in each structural unit are reacted to form a nanographene structure indicated by (a) in FIG. 2.

Figure 2:
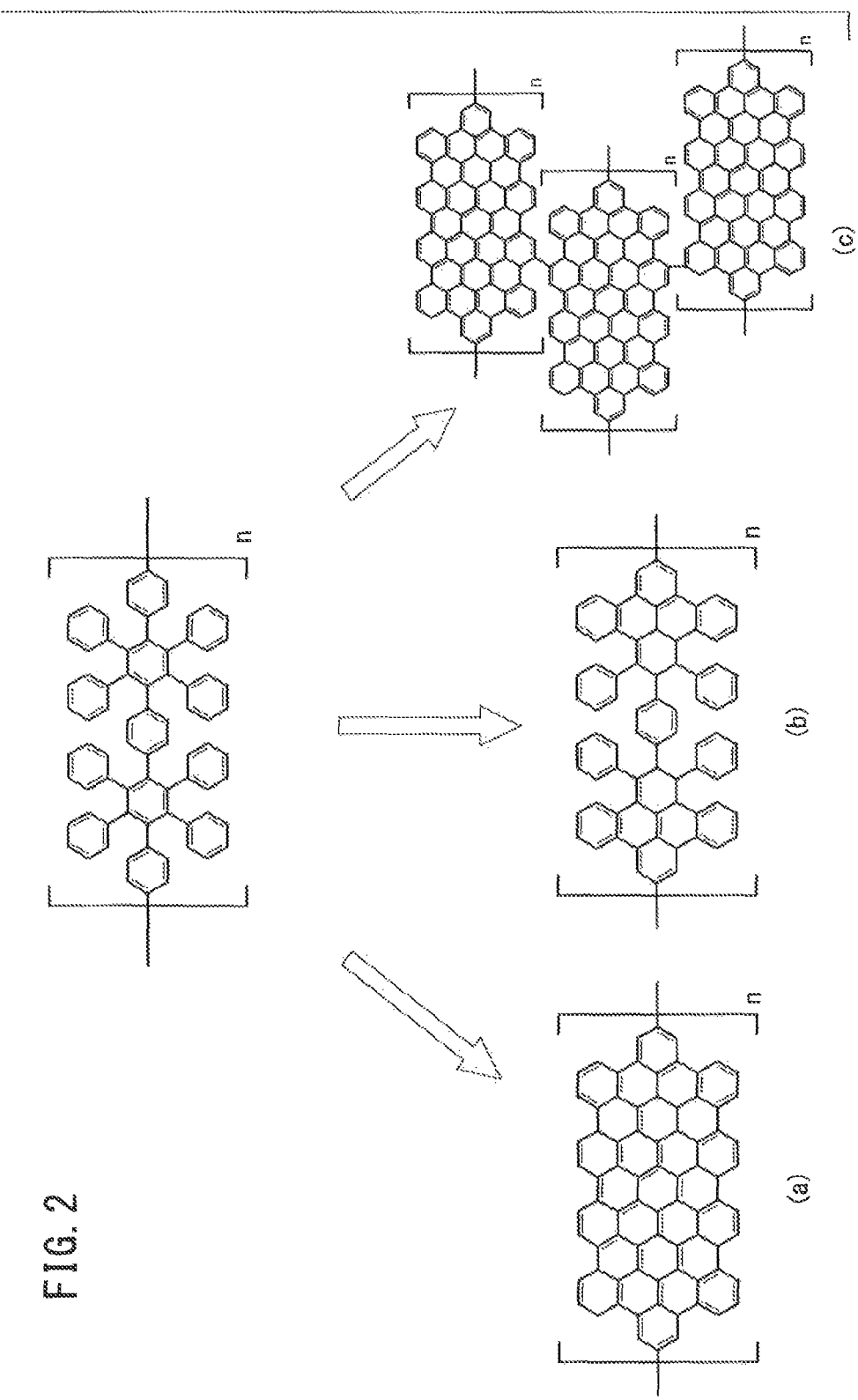
FIG. 2 is an explanatory structural view of reaction products derived from an unsubstituted polyphenylene.

In a structure indicated by (b) in FIG. 2, some aromatic rings in the structural unit are not reacted. Therefore, the nanographene polymer of (a) in FIG. 2 has more excellently spread π-electron cloud as compared with the nanographene polymer of (b) in FIG. 2. In a structure indicated by (c) in FIG. 2, a plurality of the structural units are cross-linked with each other. Therefore, the nanographene polymer of (a) in FIG. 2 has a higher solubility in an organic solvent as compared with the nanographene polymer of (c) in FIG. 2. Thus, a layer of the nanographene polymer of (a) can be more easily formed using a solution of the nanographene polymer of (a).

Figure 3:
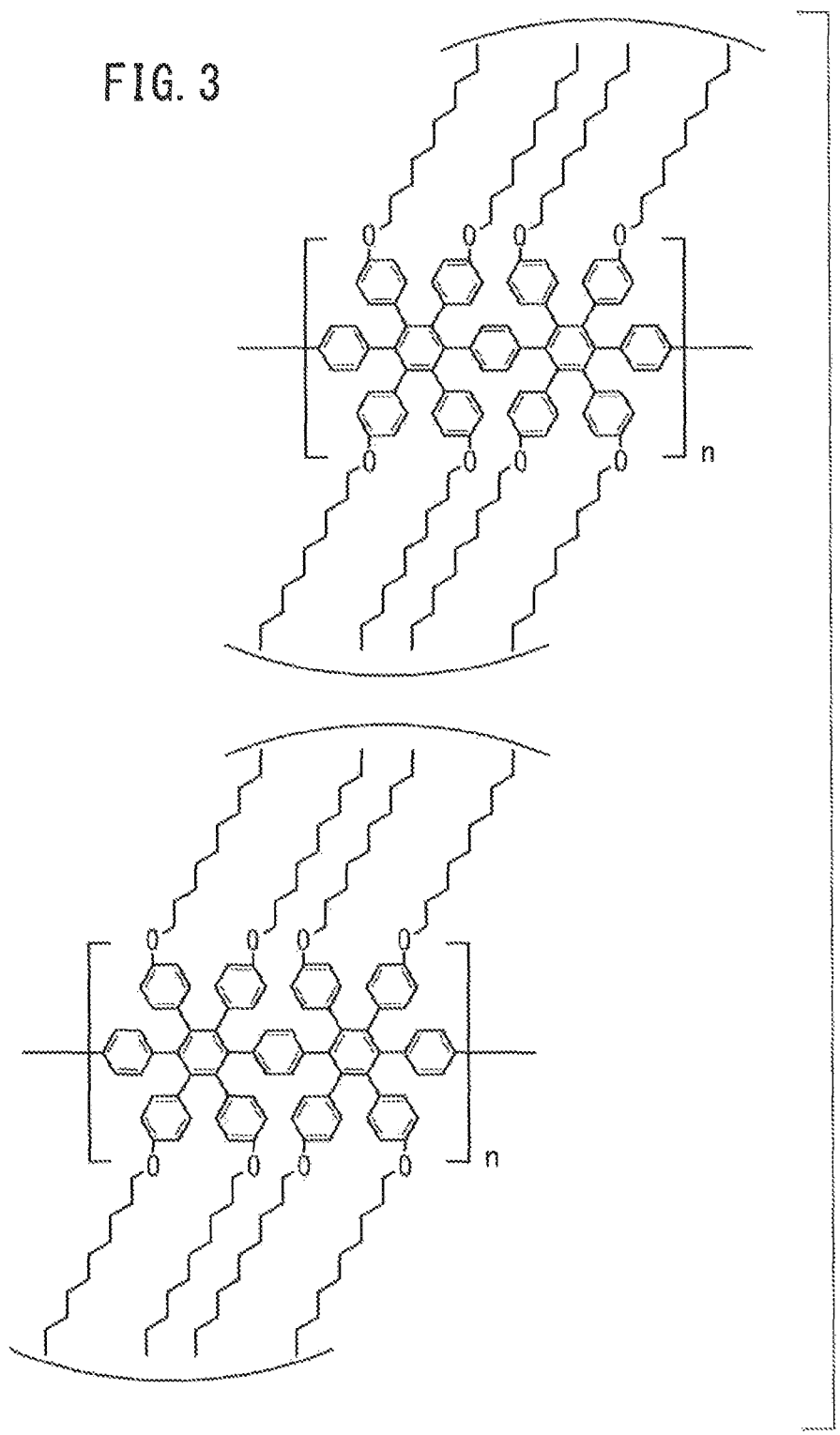
FIG. 3 is a schematic structural view for illustrating a relationship between structural units in a polyphenylene having alkoxy groups and the alkoxy groups.

In view of producing the nanographene polymer of (a) shown in FIG. 2 easily and efficiently, it is preferred that the polyphenylene has at least one alkyl or alkoxy group in at least one of R1 to R8 in the general formulae (1) to (3). For example, as shown in FIG. 3, the alkyl or alkoxy group acts as a steric hindrance in the reaction between the structural units in the polyphenylene. Thus, the structural units can be prevented from coming close to each other. The polyphenylene shown in FIG. 3 has $OC_{10}H_{21}$ groups as the alkoxy groups in R1 to R8 of the general formula (1), and the alkoxy groups are not limited thereto.

Therefore, in the polyphenylene having the alkoxy groups in R1 to R8, a plurality of the structural units can be prevented from reacting with each other, and the aromatic rings in each structural unit can be effectively reacted with each other. Thus, the nanographene polymer, which does not have a cross-linked structure of the structural units and has a sufficiently spread π-electron cloud, can be produced easily and efficiently.

Thus, by reacting the polyphenylene having at least one alkyl or alkoxy group as a side chain to thereby obtain the nanographene polymer, the nanographene polymer can also have the side chain. Consequently, the solubility of the nanographene polymer in the organic solvent can be increased. Thus, it is particularly preferred that the polyphenylene has the alkoxy group as the side chain from the viewpoint of improving the solubility of the nanographene polymer. In this case, the solubility can be further effectively increased.

The alkoxy group preferably has 1 to 20 carbon atoms. When the carbon number of the alkoxy group is within this range, the structural units in the polyphenylene can be prevented from coming close to each other, and the solubility of the nanographene polymer in the organic solvent can be improved. Thus, the polymer, which can exhibit an excellent property as the donor and can be readily dissolved in the organic solvent to form the layer, can be efficiently produced.

The moieties of the general formulae (1) to (3) are structural isomers. Therefore, when the polyphenylene having the moieties as the structural unit is reacted, the product of the nanographene polymer has at least one structural unit selected from nanographenes represented by the following general formulae (4) to (7), and the nanographenes are structural isomers.

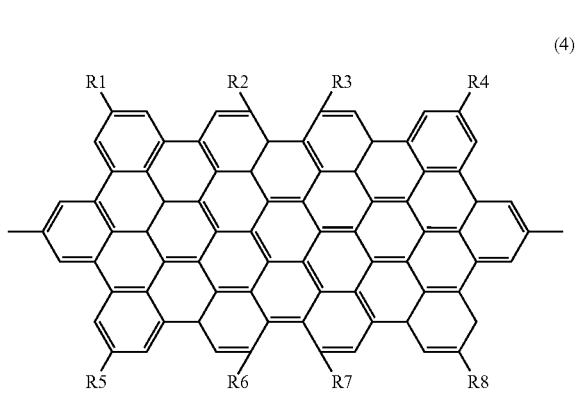

(4)

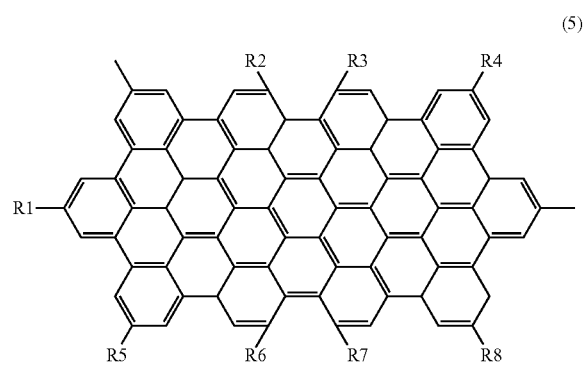

(5)

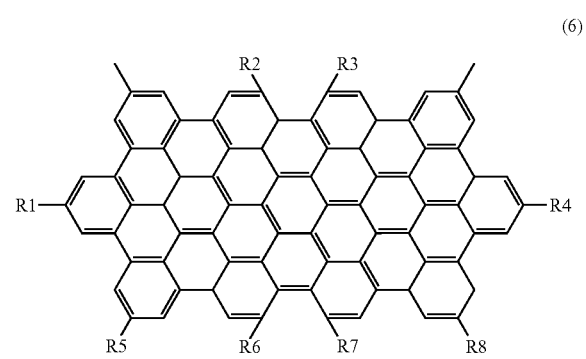

(6)

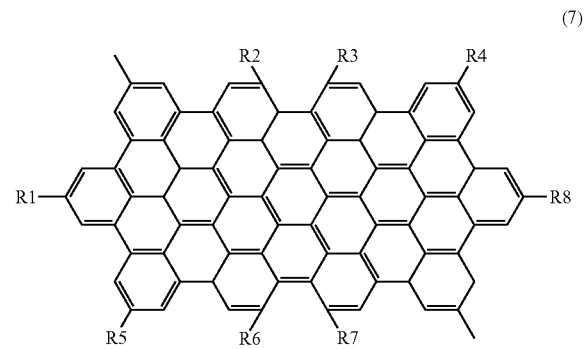

(7)

R1 to R8 in the general formulae (4) to (7) independently represent a hydrogen atom, an alkyl group, or an alkoxy group.

Thus, the photoelectric conversion material of this embodiment contains the nanographene polymer having at least one structural unit selected from the nanographenes represented by the general formulae (4) to (7). The nanographene polymer may contain only one type of the nanographenes represented by one of the general formulae (4) to (7), and the nanographenes may be bonded to each other, but the nanographene polymer is not limited thereto. For example, the nanographene polymer may be such that the nanographenes represented by the general formulae (4) to (7) are randomly bonded.

The polymerization degree of the nanographene polymer is preferably 2 to 150. When the polymerization degree (i.e., the number n of the nanographenes bonded to each other) is 2 or more, the absorbance coefficient can be sufficiently increased. On the other hand, when the polymerization degree (i.e., the number n of the nanographenes bonded to each other) is 150 or less, the time required for the polymerization for producing the nanographene polymer can be shortened, and accordingly the production efficiency of the nanographene polymer can be improved. Thus, when the polymerization degree is within the above range, the photoelectric conversion material having a sufficiently improved absorbance coefficient can be efficiently produced.

The nanographenes represented by the general formulae (4) to (7) have a molecular weight of 962 to 3333. Thus, when the nanographene polymer has a polymerization degree of 2 to 150, the nanographene polymer has a molecular weight of 1,900 to 500,000.

In the BHJ solar cell 10 (see FIG. 1), the back electrode 18 is stacked on the photoelectric conversion layer 16 containing the photoelectric conversion material containing the nanographene polymer. The back electrode 18 acts as a negative electrode, to which electrons 30 are transferred. An electron transport layer (not shown) containing bathocuproine, lithium fluoride, or the like may be interposed between the photoelectric conversion layer 16 and the back electrode 18. The electron transport layer can act to accelerate the transfer of the electrons 30 generated at the photoelectric conversion layer 16 to the back electrode 18.

The BHJ solar cell 10 of this embodiment has the above-described basic structure. Operations and advantageous effects of the BHJ solar cell 10 will be described below.

When a light (such as sunlight) is injected to the transparent electrode 12 of the BHJ solar cell 10, the light is transferred through the hole transport layer 14 to the photoelectric conversion layer 16. Then, excitons 32 are generated in the photoelectric conversion layer 16.

The generated excitons 32 are moved in the donor domain 26, and reach the interface between the donor domain 26 and the acceptor domain 28. The excitons 32 are divided into the electrons 30 and the holes 24 on the interface. As described above, the electrons 30 are moved in the acceptor domain 28, are transferred through the electron transport layer, and reach the back electrode 18 used as the negative electrode. On the other hand, the holes 24 are moved in the donor domain 26, are transferred through the hole transport layer 14, and reach the transparent electrode 12 used as the positive electrode.

In this embodiment, the donor domain 26 in the photoelectric conversion layer 16 contains the nanographene polymer (the photoelectric conversion material) having at least one structural unit selected from the nanographenes represented by the general structural formulae (4) to (7).

As is clear from the general formulae (4) to (7), the π-electron cloud spreads over the entire nanographene. The donor domain 26 contains the nanographene polymer having the structural unit of the nanographene. Thus, the π-electron cloud spreads over a wider area in the donor domain 26 than in the single nanographene (monomer).

The donor domain 26, which has such a sufficiently spread π-electron cloud, exhibits a maximum absorption wavelength shifted to the longer-wavelength side and has a high absorbance coefficient. Thus, the donor domain 26 exhibits a narrow bandgap (Eg) corresponding to a small energy level difference between the HOMO and LUMO. Consequently, the excitons 32 are actively generated in the donor domain 26, resulting in a high sunlight utilization efficiency.

The BHJ solar cell 10 exhibits an excellent photoelectric power conversion efficiency because of the above properties. Therefore, only a smaller area of the BHJ solar cell 10 is required for achieving a desired power generation capacity in comparison with the other solar cells having the same power generation capacity. Consequently, the BHJ solar cell 10 can have a lighter weight and a smaller load on its installation site, so that the layout of the BHJ solar cell 10 can be designed more freely.

A method for producing the photoelectric conversion material (i.e., the nanographene polymer) according to this embodiment will be described below.

As described above, the nanographene polymer can be obtained as the reaction product derived from the polyphenylene having the alkoxy group. An example, which includes reacting the polyphenylene of FIG. 3 to produce the nanographene polymer, will be described hereinafter. The structural unit of the polyphenylene is the moiety having $OC_{10}H_{21}$ groups in R1 to R8 in the general formula (1). The structural unit of the nanographene polymer derived from the polyphenylene is the nanographene having $OC_{10}H_{21}$ groups in R1 to R8 in the general formula (4).

It is to be understood that the polyphenylene having the structural unit of the general formula (2) or (3) is a structural isomer of the polyphenylene having the structural unit of the general formula (1), and the polyphenylene having the structural unit of the general formula (2) or (3) can be prepared in the same manner as the polyphenylene having the structural unit of the general formula (1). The nanographene polymer having the structural unit of the general formula (4) can be produced from the polyphenylene having the structural unit of the general formula (1), and the nanographene polymer having the structural unit of the general formula (5), (6), or (7) can be produced from the polyphenylene having the structural unit of the general formula (2) or (3) in the same manner.

In a case where the hydrogen atom or the alkyl group is used instead of the alkoxy group in R1 to R8 in the general formulae (1) to (3), the nanographene polymers having the hydrogen atom or the alkyl group can be produced in the same manner.

(A) a dibenzyl ketone having the alkoxy groups ($OC_{10}H_{21}$) and (B) a 1,4-bisbenzil having the alkoxy groups ($OC_{10}H_{21}$) are prepared to produce the polyphenylene having the alkoxy groups.

Specifically, 1,3-didecyloxybenzene-2-propanone is prepared as (A) the dibenzyl ketone having the alkoxy groups ($OC_{10}H_{21}$). First, 4-hydroxybenzeneacetic acid methyl ester is reacted with 1-iododecane to obtain 4-decyloxybenzeneacetic acid methyl ester as shown in the following reaction formula (8).

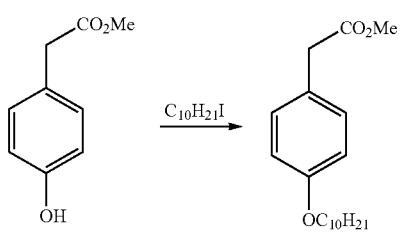

(8)

Then, lithium diisopropylamide (LDA) is added to 4-decyloxybenzeneacetic acid methyl ester, and hydrochloric acid is further added to the intermediate as shown in the following reaction formula (9). As a result, 1,3-didecyloxybenzene-2-propanone is prepared as the dibenzyl ketone having the alkoxy groups.

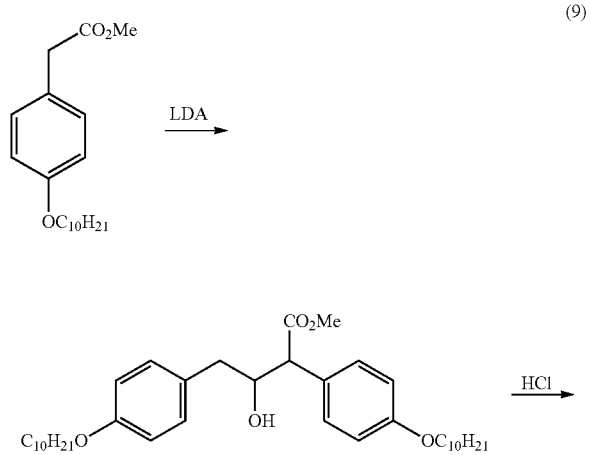

(9)

-continued

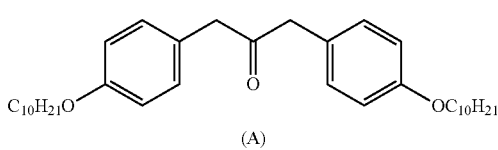

(A)

Meanwhile, in the preparation of (B) the 1,4-bisbenzil having the alkoxy groups, iodophenol is reacted with bromodecane to obtain 1-decyloxy-4-iodobenzene as shown in the following reaction formula (10).

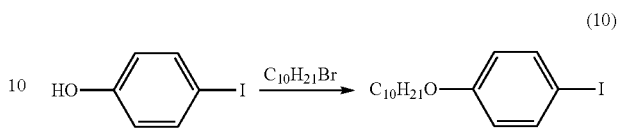

(10)

Then, 1-decyloxy-4-iodobenzene and 1,4-diethynylbenzene are reacted to obtain 1,4-bis(decyloxyphenylethynyl)benzene as shown in the following reaction formula (11).

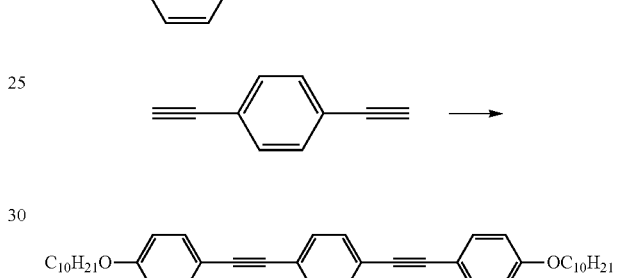

(11)

1,4-bis(decyloxyphenylethynyl)benzene is oxidized using a catalyst such as a palladium (Pd) complex to prepare the 1,4-bisbenzil having the alkoxy groups as shown in the following reaction formula (12).

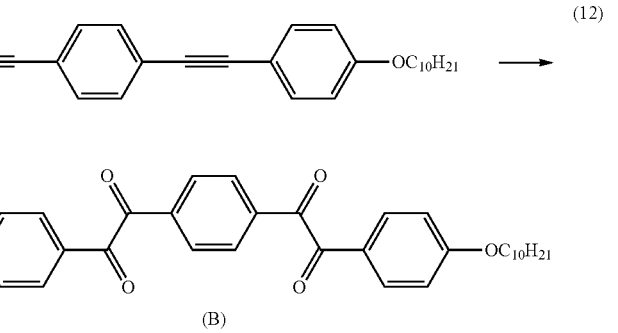

(12)

(B)

(A) 1,3-didecyloxybenzene-2-propanone and (B) the alkoxylated 1,4-bisbenzil thus obtained are reacted. Thus, a methanol solution of Triton B is added to a solution containing 1,3-didecyloxybenzene-2-propanone, the alkoxylated 1,4-bisbenzil, and n-butanol under heating as shown in the following reaction formula (13). Triton B is benzyltrimethylammonium hydroxide. As a result, (C) an alkoxylated 3,3'-(1,4-phenylene)bis(2,4,5,-triphenyl-2,4-cyclopentadiene-1-one) (phenylene derivative) is prepared.

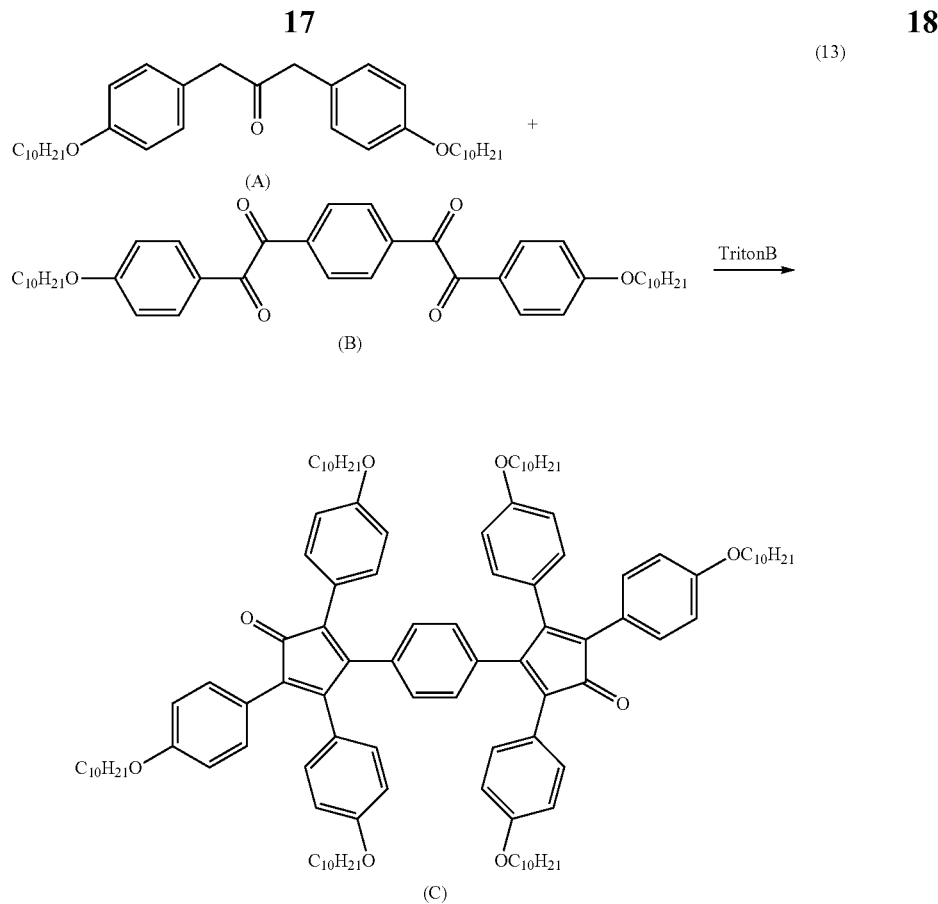
A Diels-Alder polymerization reaction of (C) the alkoxylated 3,3'-(1,4-phenylene)bis(2,4,5,-triphenyl-2,4-cyclopentadiene-1-one) and (D) 4,4'-bis(decyloxyphenylethynyl)biphenyl is carried out as shown in the following reaction formula (14). As a result, the polyphenylene having the alkoxy groups is obtained.
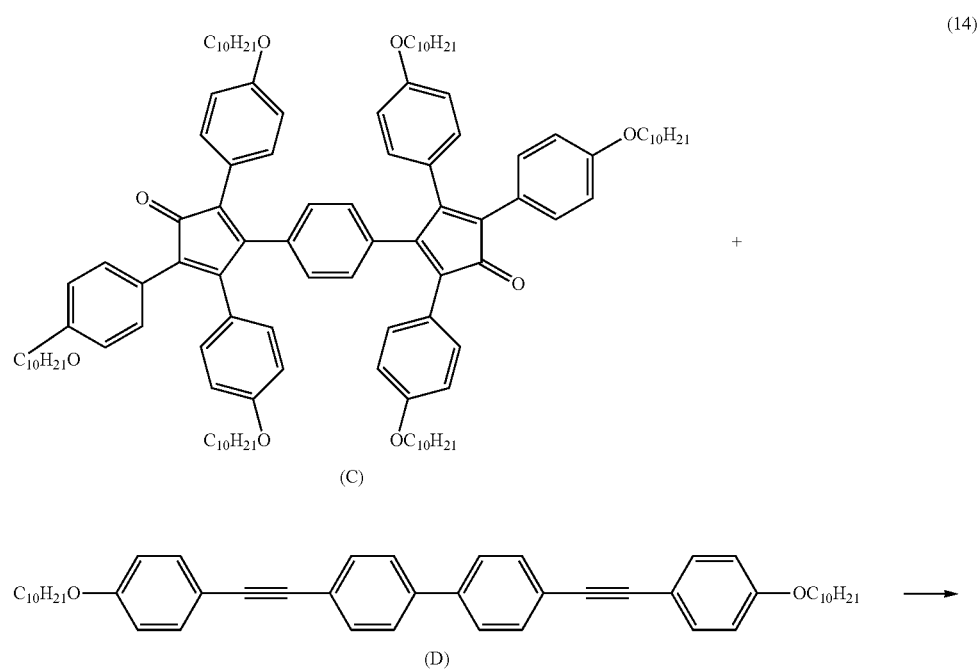

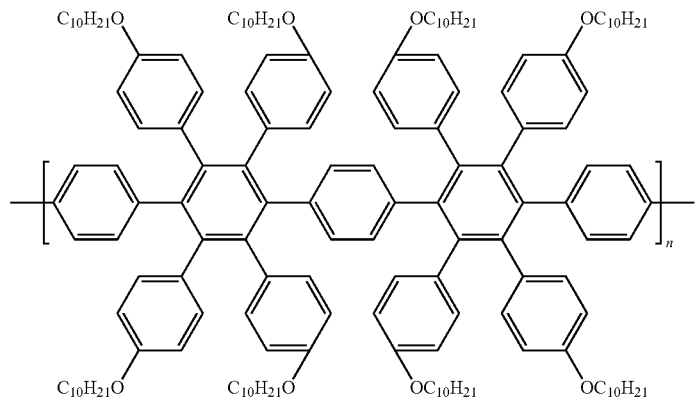

(D) 4,4'-bis(decyloxyphenylethynyl)biphenyl can be prepared as follows. First, iodophenol is reacted with bromodecane to obtain 1-decyloxy-4-iodobenzene as shown in the above reaction formula (10).

Then, 1-decyloxy-4-iodobenzene and 4,4'-diethynylbiphenyl are reacted in the presence of a catalyst in a solvent as shown in the following reaction formula (15). The solvent may be tetrahydrofuran (THF: $C_4H_8O$). The catalyst may contain bis(triphenylphosphine) palladium (II) dichloride (($Ph_3P)_2PbCl_2$), copper iodide (CuI), and diethylamine ($Et_2NH$). Thus, 4,4'-bis(decyloxyphenylethynyl)biphenyl is obtained by the reaction.

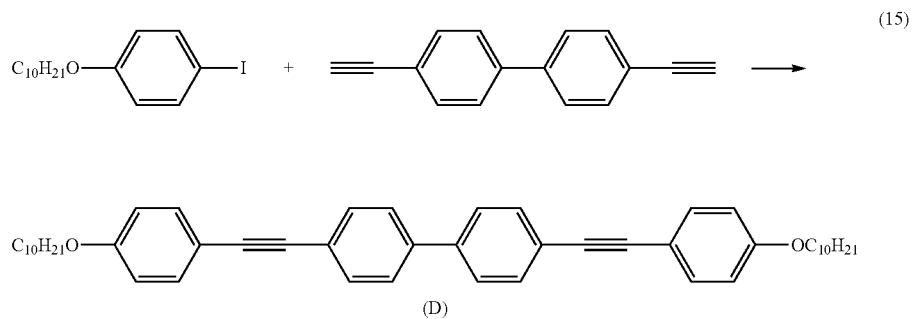

For example, the thus-obtained polyphenylene having the alkoxy groups is reacted in the presence of a Lewis acid catalyst such as ferric chloride ($FeCl_3$) to produce the nanographene polymer having the alkoxy groups as shown in the following reaction formula (16).

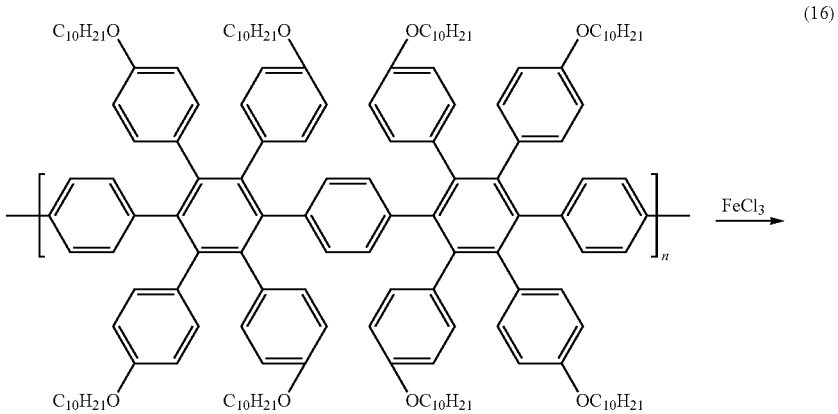

-continued

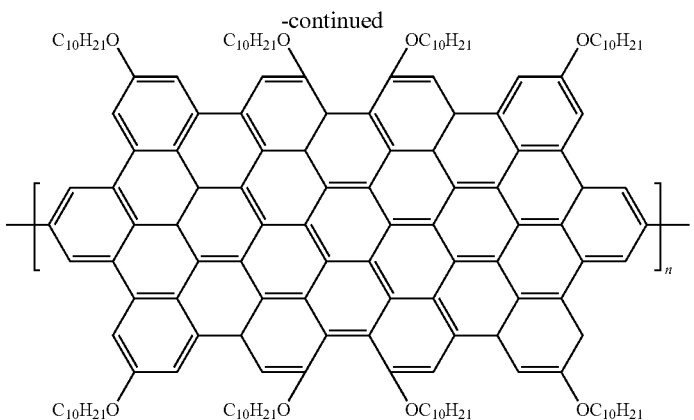

Since the polyphenylene has the alkoxy groups as described above, coupling of the structural units (intermolecular coupling) is inhibited in this reaction. Therefore, all the aromatic rings in each of the structural units can be reacted, while preventing the cross-linking between the structural units, e.g., by controlling the amount of the ferric chloride catalyst. Consequently, the π-electron cloud can be sufficiently spread over the structural units in the condensed aromatic ring nanographene polymer. Also in a case where the polyphenylene has the alkyl group as the side chain, the same effects can be achieved.

The polymerization degree of the nanographene polymer can be controlled, preferably within a range of 2 to 150, e.g., by appropriately selecting the reaction temperature and/or the reaction time in the polymerization. In this case, the photoelectric conversion material (nanographene polymer) having a sufficiently-improved absorbance coefficient can be efficiently produced.

Figure 4:
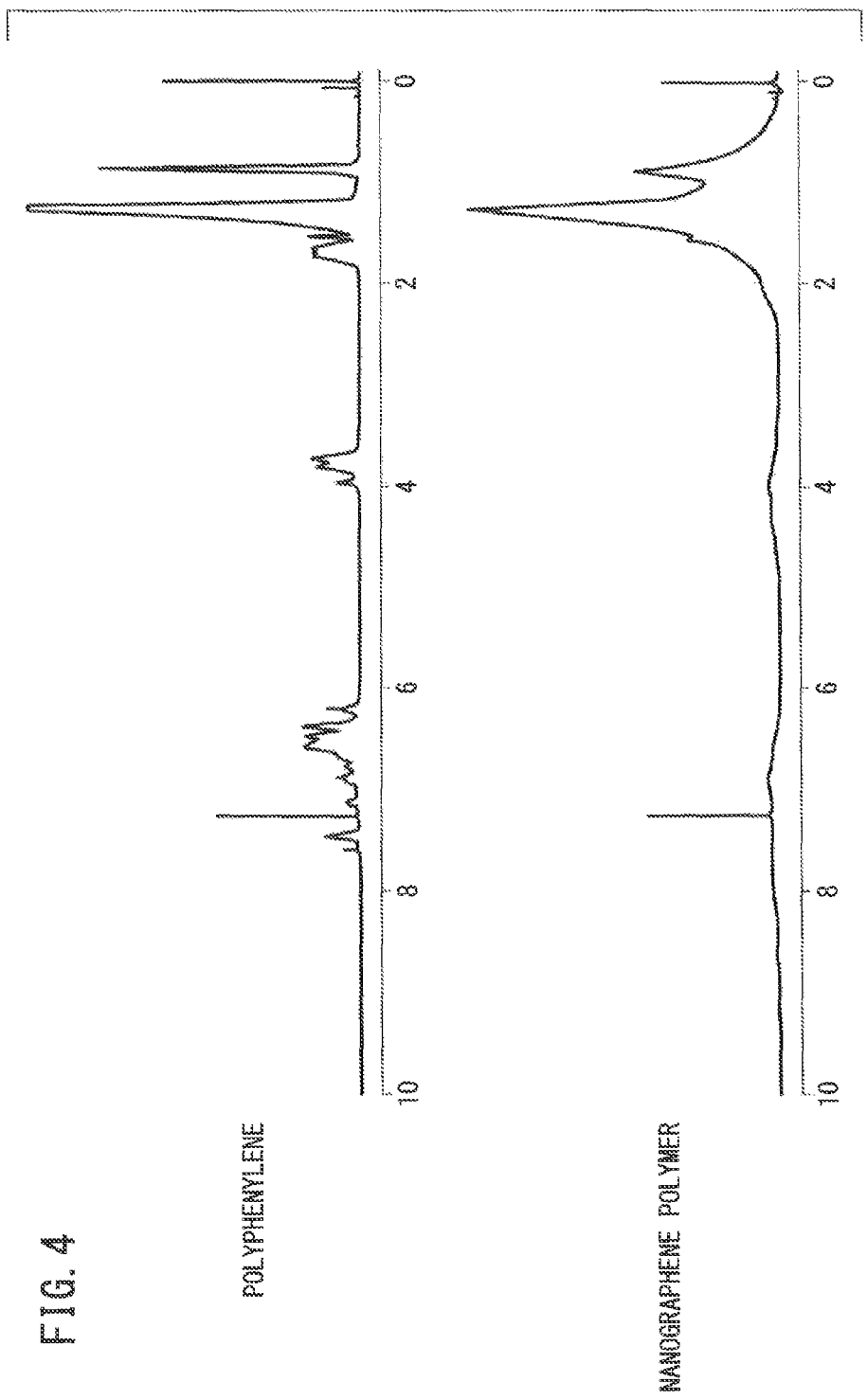
FIG. 4 is a diagram including $^1$H-nuclear magnetic resonance (NMR) spectra of the polyphenylene of FIG. 3 and a photoelectric conversion material (nanographene polymer) according to this embodiment obtained by reacting the polyphenylene.

FIG. 4 is a diagram including $^1$H-nuclear magnetic resonance (NMR) spectra of the polyphenylene having the alkoxy groups (shown in FIG. 3) and the nanographene polymer obtained by the reaction of the polyphenylene. In the spectra, peaks of the hydrogen atoms in the alkoxy groups are observed within a range of 0 to 2 ppm, and peaks of the hydrogen atoms in the phenyl groups are observed within a range of 6 to 8 ppm.

As shown in FIG. 4, the peaks of the hydrogen atoms in the alkoxy groups are observed in the spectrum of the polyphenylene, and are observed also in the spectrum of the nanographene polymer. It is clear that the nanographene polymer having the alkoxy groups can be produced by the reaction of the polyphenylene having the alkoxy groups.

The peaks of the hydrogen atoms in the phenyl groups are observed in the spectrum of the polyphenylene, but are not observed in the spectrum of the nanographene polymer. It is clear that the phenyl groups in the structural units of the polyphenylene are reacted with each other to form the condensed aromatic rings in the nanographene polymer. Thus, the nanographene polymer is a π-conjugated polymer.

Figure 5:
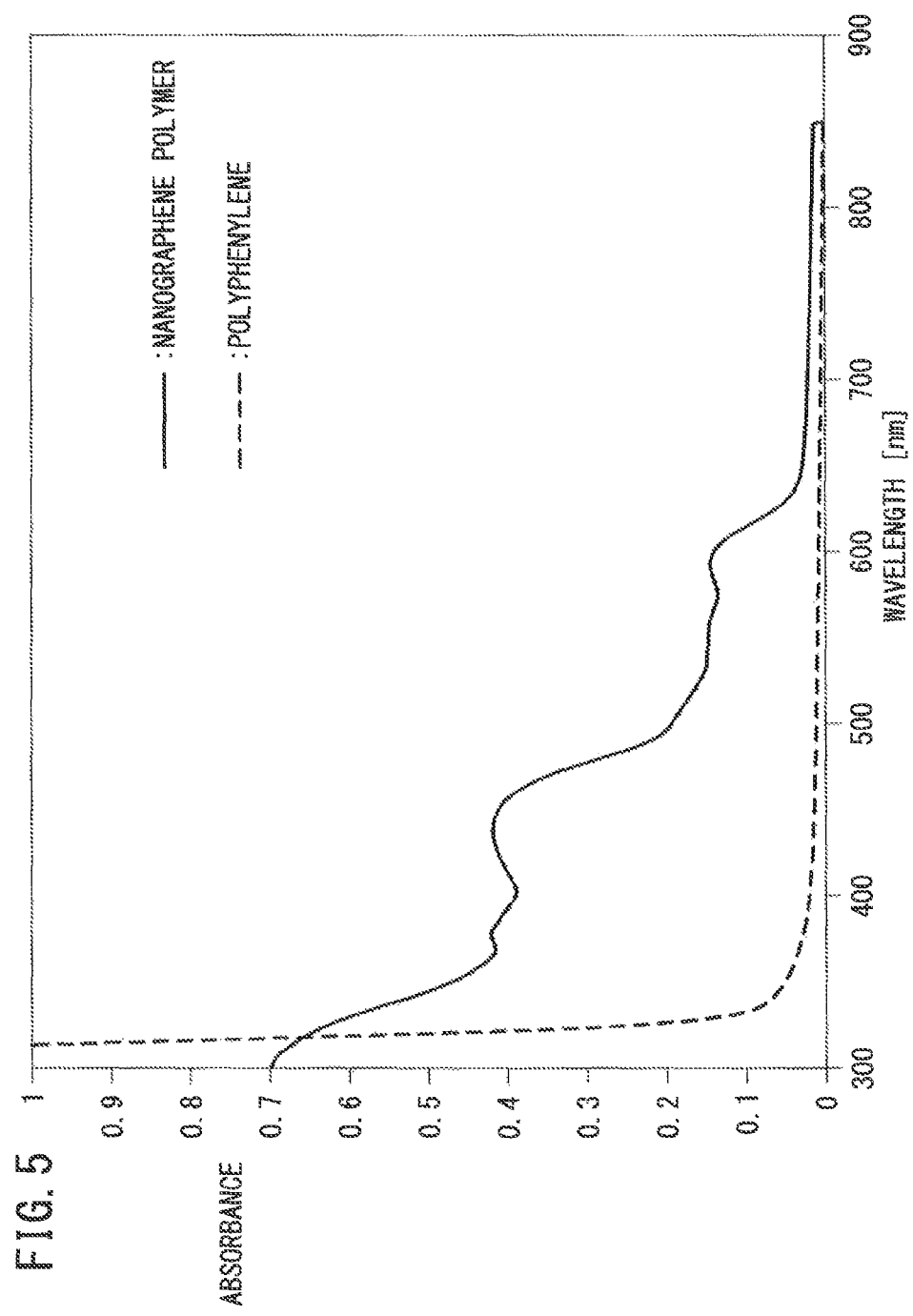
FIG. 5 is a diagram including absorption spectra obtained by ultraviolet-visible spectroscopy concerning the polyphenylene of FIG. 3 and the nanographene polymer obtained by reacting the polyphenylene.

FIG. 5 is a diagram including ultraviolet-visible (UV-Vis) absorption spectra of the polyphenylene having the alkoxy groups (shown in FIG. 3) and the nanographene polymer obtained by the reaction of the polyphenylene.

As shown in FIG. 5, the long-wavelength absorption edge of the polyphenylene is observed at about 330 nm, while the long-wavelength absorption edge of the nanographene polymer is observed at about 650 nm. Thus, the maximum absorption wavelength of the nanographene polymer is shifted to the longer-wavelength side as compared with the long-wavelength absorption edge (i.e., the maximum absorption wavelength) of the polyphenylene. In general, in a π-conjugated system, as the molecular weight and the π-electron number is increased, the maximum absorption wavelength is shifted to the longer-wavelength side and the light absorption region is expanded to the visible region. Thus, it is clear from FIG. 5 that the nanographene polymer is the π-conjugated polymer having the π-electron cloud sufficiently spread over the condensed aromatic ring structural units.

Figure 6:
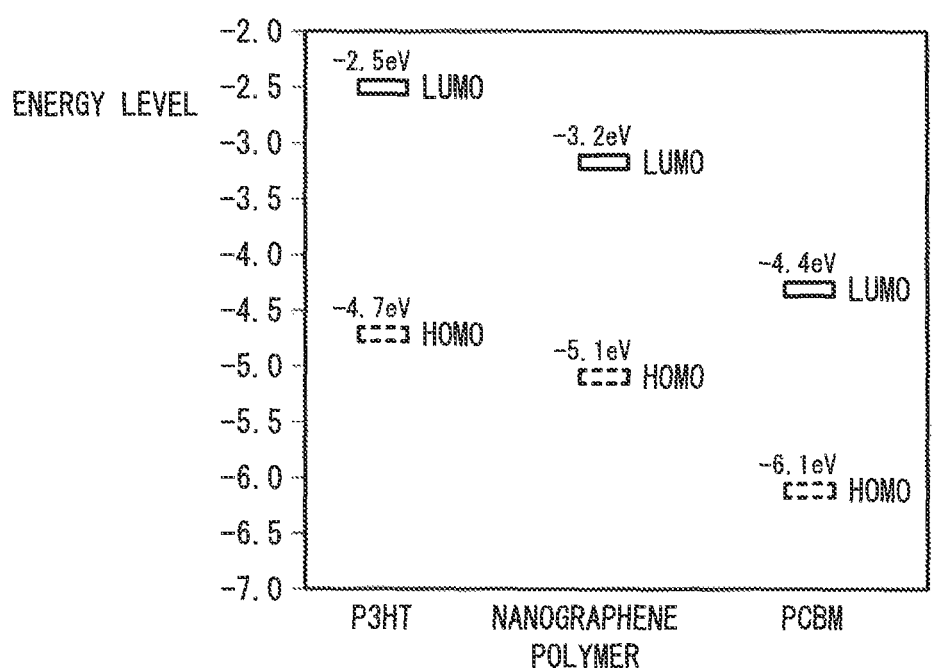
FIG. 6 is an energy level diagram showing the HOMO and LUMO energy levels of the nanographene polymer obtained by reacting the polyphenylene of FIG. 3, P3HT, and PCBM.
Figure 7:
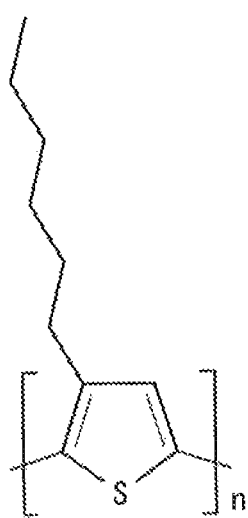
FIG. 7 is an explanatory view of a structural formula of P3HT.
Figure 8:
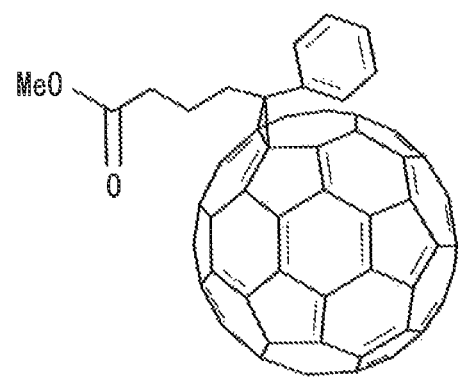
FIG. 8 is an explanatory view of a structural formula of PCBM.
Figure 9:
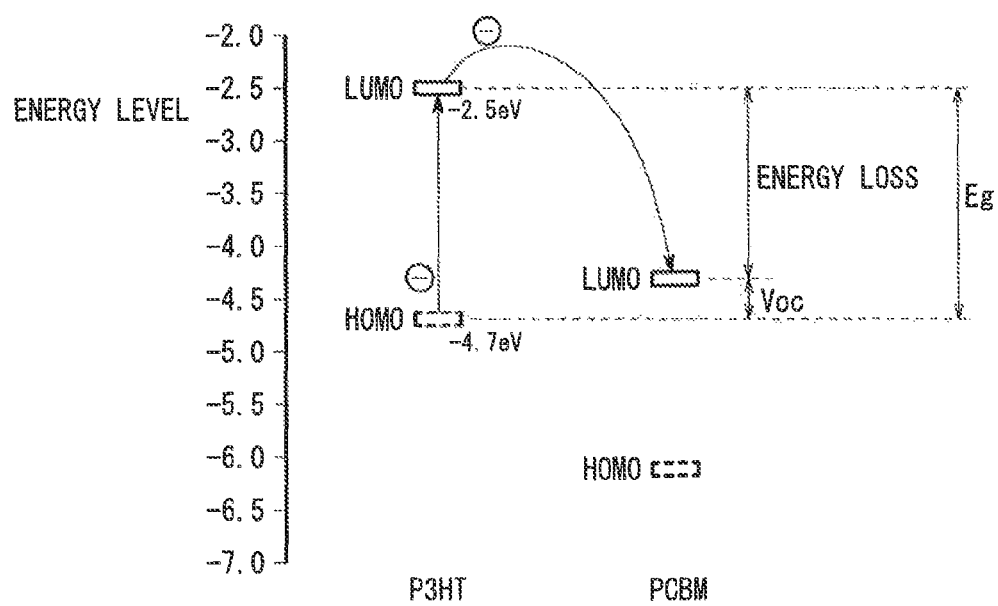
FIG. 9 is a schematic explanatory view for illustrating electron transition from the HOMO of P3HT through the LUMO of P3HT to the LUMO of PCBM.

FIG. 6 is a diagram showing the HOMO and LUMO energy levels of the nanographene polymer, P3HT, and PCBM, measured by an ultraviolet-visible absorption spectroscopic analysis (UV-Vis) and a photoelectron yield spectroscopic analysis (PYS).

As shown in FIG. 6, the nanographene polymer has a bandgap Eg of 1.9 eV (corresponding to the HOMO-LUMO energy level difference), and P3HT has a bandgap Eg of 2.2 eV. Thus, the bandgap Eg of the nanographene polymer is narrower than that of P3HT.

The nanographene polymer has a LUMO energy level of about −3.2 eV, which is deeper than that of P3HT (about −2.5 eV). Thus, the LUMO energy level of the nanographene polymer is closer to that of PCBM (a fullerene derivative) than that of P3HT. This is likely because the nanographene structural unit in the nanographene polymer is the condensed aromatic ring having an aromatic hydrocarbon ring as a basic skeleton, which is similar to the structure of PCBM. Therefore, in the BHJ solar cell 10 including the photoelectric conversion layer 16 having the nanographene polymer as a donor and the PCBM as an acceptor, the open circuit voltage Voc can be greater than that in a case of the layer having the P3HT as a donor.

The photoelectric conversion layer 16 containing the nanographene polymer can be formed as follows.

A mixture of the nanographene polymer and PCBM is added to an appropriate solvent such as toluene, chloroform, chlorobenzene, or the like. Alternatively, the nanographene polymer and PCBM may be separately added to the solvent. Since the nanographene polymer and PCBM are readily dissolved in an organic solvent, a mixture solution can be easily prepared.

The mixture solution is applied onto the hole transport layer 14 by a spin coating process, an ink-jet printing process, a roll casting process, a roll-to-roll process, or the like.

The applied mixture solution on the hole transport layer 14 is hardened under heating, whereby the photoelectric conversion layer 16 is formed. The photoelectric conversion layer 16 may be subjected to an annealing treatment if necessary. In the annealing treatment, the phase separation between the donor domain 26 and the acceptor domain 28 can be further improved, and the joint interface area between the donor domain 26 and the acceptor domain 28 can be increased to improve the power generation function.

In a case where a monomer is used as the donor, it is difficult to use the above process for forming the photoelectric conversion layer 16 because of the low solubility of the monomer in the organic solvent. In contrast, in this embodiment, the nanographene polymer having a soluble group is used as the donor as described above. Since the nanographene polymer is readily soluble in a predetermined solvent, the photoelectric conversion layer 16 can be simply formed with ease at low cost by the above process. Furthermore, since the phase separation between the donor domain 26 and the acceptor domain 28 can be further facilitated, the photoelectric power conversion efficiency of the BHJ solar cell 10 can be improved.

As described above, the nanographene polymer of this embodiment is the π-conjugated polymer having the widely spread π-electron cloud, and therefore has a high absorbance coefficient. Furthermore, the nanographene polymer can satisfactorily absorb the long-wavelength (near-infrared) light to improve the sunlight utilization efficiency. In addition, the nanographene polymer has a narrow bandgap Eg and a low HOMO energy level. Thus, the LUMO energy level of the nanographene polymer is close to that of PCBM.

Therefore, in the BHJ solar cell 10 using the nanographene polymer as the donor and the PCBM as the acceptor, the excitons 32 can be actively generated. Furthermore, the BHJ solar cell 10 can exhibit a high open circuit voltage Voc. Thus, the photoelectric power conversion efficiency can be improved suitably.

The present invention is not limited to the above embodiment, and various changes and modifications may be made therein without departing from the scope of the invention.

For example, the above embodiment is described with relation to the BHJ solar cell 10 having the photoelectric conversion layer 16 containing the mixture of the donor and the acceptor. However, the nanographene polymer (photoelectric conversion material) may be used in a planar heterojunction-type organic photovoltaic cell having a donor layer and an acceptor layer formed separately from each other. In this case, the nanographene polymer may be contained in the donor layer.

In the above embodiment, the nanographene polymer is used as the donor in the organic photovoltaic cells. The present invention is not particularly limited thereto, and the nanographene polymer may be used as the acceptor in the organic photovoltaic cells.

Furthermore, the use of the nanographene polymer is not limited to the use in the photoelectric conversion layer 16 in the organic photovoltaic cells. For example, the nanographene polymer may be used in an optical sensor.

What is claimed is:

1. A photoelectric conversion material that acts as an electron donor for donating an electron or an electron acceptor for accepting an electron, comprising:
    a polymer obtained by reaction of a polyphenylene having at least one structural unit selected from moieties represented by the following general formulae (1) to (3):

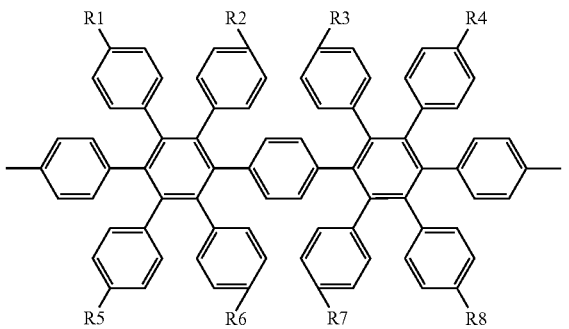

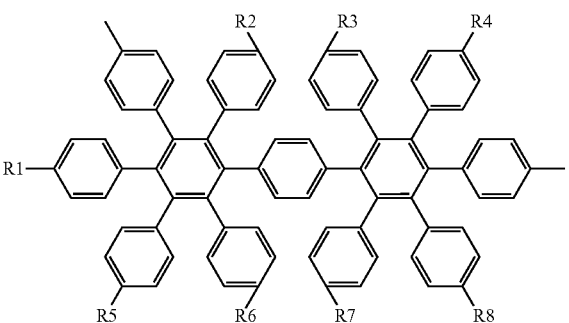

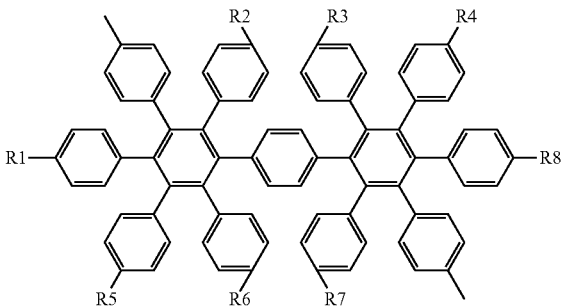

wherein R1 to R8 in the general formulae (1) to (3) independently represent a hydrogen atom, an alkyl group, or an alkoxy group.

2. The photoelectric conversion material according to claim 1, wherein R1 to R8 in the general formulae (1) to (3) independently represent an alkoxy group having 1 to 20 carbon atoms.

3. The photoelectric conversion material according to claim 1, wherein the polymer has at least one structural unit selected from graphenes represented by the following general formulae (4) to (7):

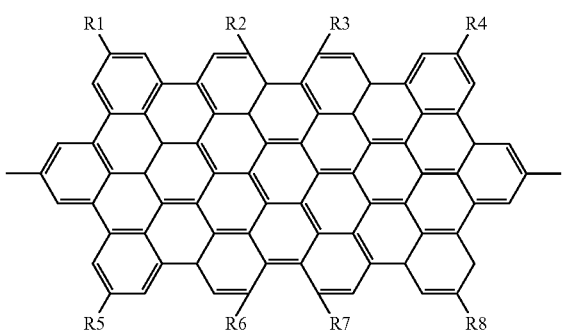

(5)

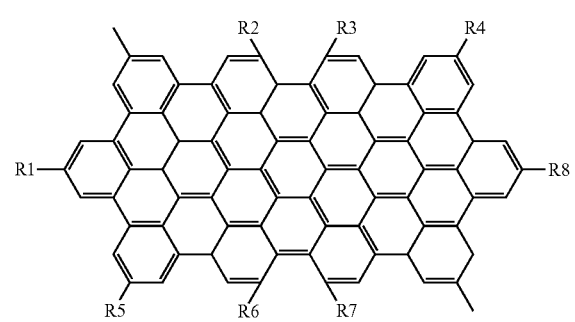

(6)

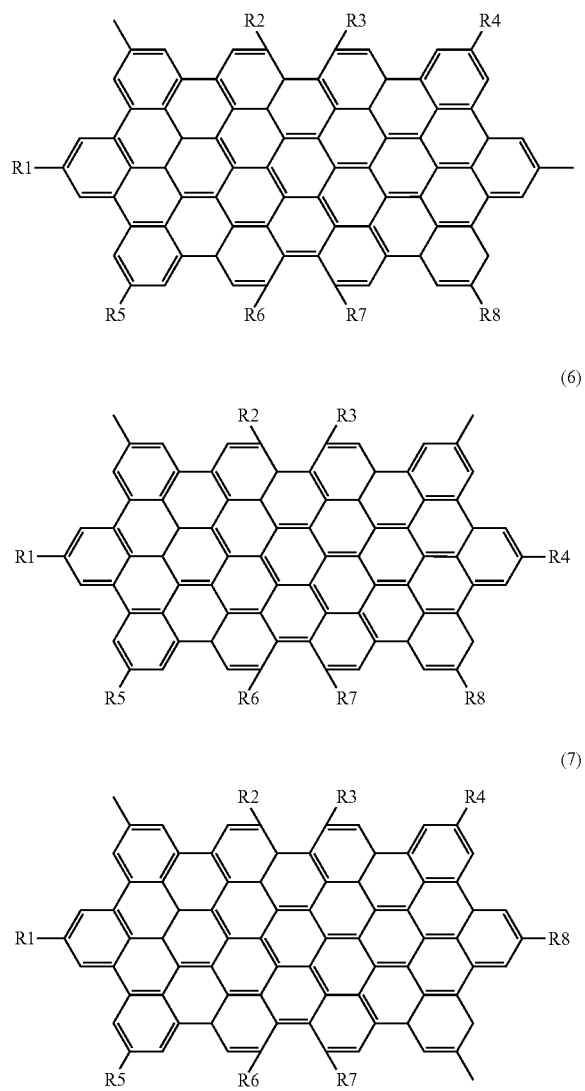

(7)

wherein R1 to R8 in the general formulae (4) to (7) independently represent a hydrogen atom, an alkyl group, or an alkoxy group.

4. The photoelectric conversion material according to claim 1, wherein the polymer has a polymerization degree of 2 to 150.

5. The photoelectric conversion material according to claim 4, wherein the polymer has a molecular weight of 1,900 to 500,000.

6. A method for producing a photoelectric conversion material that acts as an electron donor for donating an electron or an electron acceptor for accepting an electron, comprising:
polymerizing a phenylene derivative to prepare a polyphenylene; and
reacting the polyphenylene to prepare a polymer as the photoelectric conversion material,
wherein the polyphenylene has at least one structural unit selected from moieties represented by the following general formulae (1) to (3):

(1)

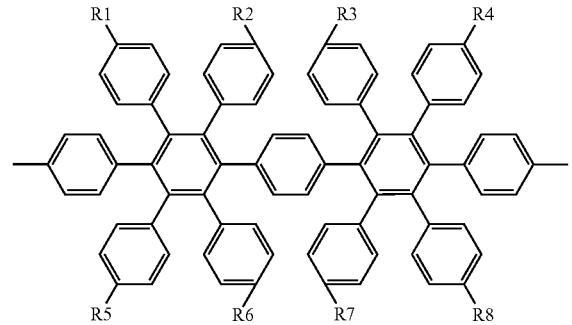

(2)

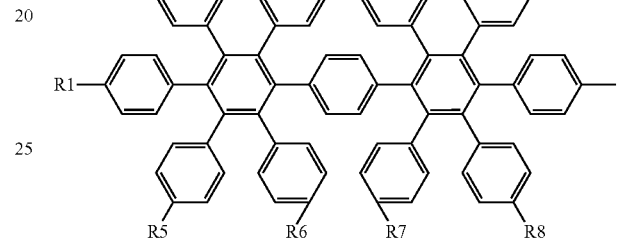

(3)

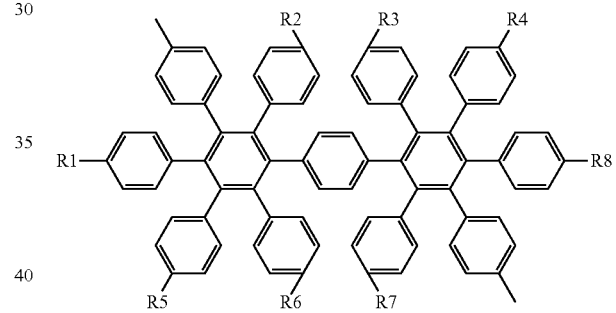

wherein R1 to R8 in the general formulae (1) to (3) independently represent a hydrogen atom, an alkyl group, or an alkoxy group.

7. The method according to claim 6, wherein R1 to R8 in the general formulae (1) to (3) independently represent an alkoxy group having 1 to 20 carbon atoms.

8. The method according to claim 6, wherein the polymer has at least one structural unit selected from graphenes represented by the following general formulae (4) to (7):

(4)

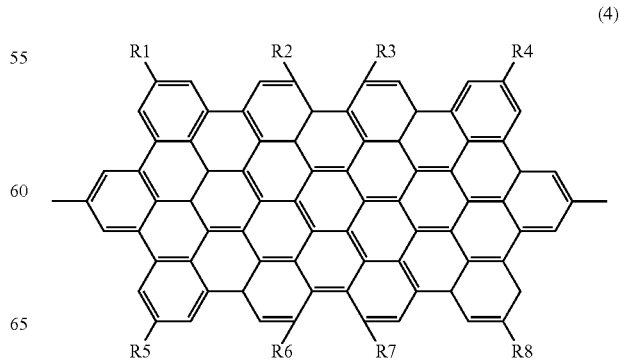

ing at least one structural unit selected from moieties represented by the following general formulae (1) to (3):

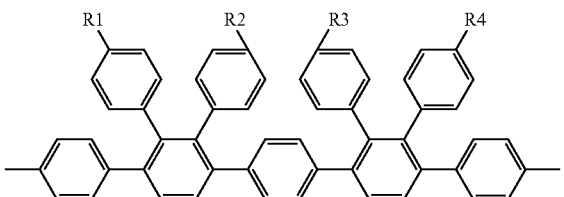

(1)

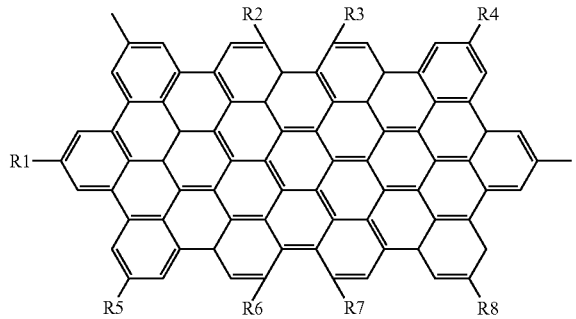

(5)

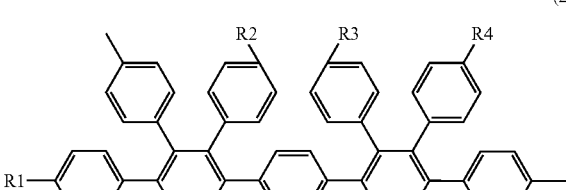

(2)

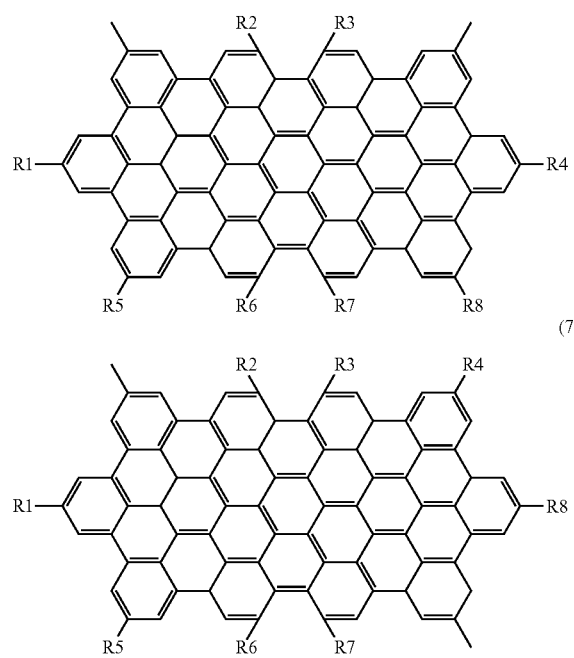

(6)

(7)

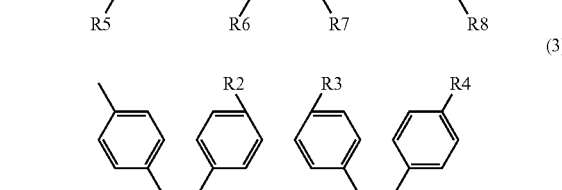

(3)

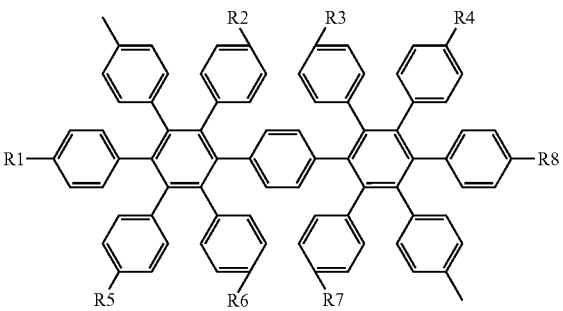

wherein R1 to R8 in the general formulae (4) to (7) independently represent a hydrogen atom, an alkyl group, or an alkoxy group.

9. The method according to claim 6, wherein the polymer has a polymerization degree of 2 to 150.

10. An organic photovoltaic cell comprising a photoelectric conversion material that acts as an electron donor for donating an electron or an electron acceptor for accepting an electron, wherein
the organic photovoltaic cell has a photoelectric conversion layer, and
the photoelectric conversion layer contains, as the electron donor, the photoelectric conversion material containing a polymer obtained by reaction of a polyphenylene havwherein R1 to R8 in the general formulae (1) to (3) independently represent a hydrogen atom, an alkyl group, or an alkoxy group.

11. The organic photovoltaic cell according to claim 10, including a bulk heterojunction structure containing the photoelectric conversion layer wherein
the photoelectric conversion layer contains a mixture of the electron donor and an electron acceptor for accepting an electron released from the electron donor.

* * * * *